(12) United States Patent
Kim

(10) Patent No.: US 7,235,453 B2
(45) Date of Patent: Jun. 26, 2007

(54) METHOD OF FABRICATING MIM CAPACITOR

(75) Inventor: Yung Pil Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 183 days.

(21) Appl. No.: 11/027,838

(22) Filed: Dec. 29, 2004

(65) Prior Publication Data

US 2005/0142851 A1    Jun. 30, 2005

(30) Foreign Application Priority Data

Dec. 31, 2003    (KR) .................. 10-2003-0101605

(51) Int. Cl.
*H01L 21/20* (2006.01)

(52) U.S. Cl. .............. 438/396; 438/240; 438/253; 257/306; 257/309; 257/E29.346; 257/E25.014

(58) Field of Classification Search ........... 438/396, 438/240, 253; 257/306, 309
See application file for complete search history.

(56) References Cited

U.S. PATENT DOCUMENTS

| 6,249,054 | B1 | 6/2001 | Tanigawa |
| 6,387,775 | B1 | 5/2002 | Jang et al. |
| 6,410,381 | B2 | 6/2002 | Kim et al. |
| 6,528,366 | B1 | 3/2003 | Tu et al. |
| 6,559,493 | B2 | 5/2003 | Lee et al. |
| 6,794,702 | B2 | 9/2004 | Park |
| 6,916,722 | B2 * | 7/2005 | Huang et al. ............ 438/396 |
| 6,982,472 | B2 * | 1/2006 | Kiyotoshi ................ 257/532 |
| 7,002,201 | B2 * | 2/2006 | Yasuda .................... 257/306 |
| 2002/0163029 | A1 * | 11/2002 | Dirnecker et al. ........ 257/306 |

* cited by examiner

*Primary Examiner*—Asok K. Sarkar
*Assistant Examiner*—Victor V. Yevsikov
(74) *Attorney, Agent, or Firm*—Andrew D. Fortney

(57) ABSTRACT

A method of fabricating an MIM capacitor is provided, by which higher capacitance can be secured per unit volume or area by forming a dual-stack type capacitor to increase an effective area of the capacitor. The method includes patterning a first metal layer, forming a planarized second insulating layer having a trench exposing a portion of the patterned first metal layer, forming a second metal layer within the trench, forming a first dielectric layer on the second metal layer, forming first via holes exposing the patterned first metal layer, forming first plugs filling the trench and first via holes, forming a third metal layer thereover, forming a second dielectric layer on the third metal layer, forming a patterned fourth metal layer on the second dielectric layer, patterning the second dielectric layer and the third metal layer, forming a planarized third insulating layer having second via holes therein, and forming a patterned fifth metal layer on the third insulating layer.

20 Claims, 5 Drawing Sheets

METHOD OF FABRICATING MIM CAPACITOR

This application claims the benefit of the Korean Application No. P2003-101605 filed on Dec. 31, 2003, which is hereby incorporated by reference.

BACKGROUND OF THE INVENTION

1. Field of the Invention

The present invention relates to a method of fabricating a semiconductor device, and more particularly, to a method of fabricating an MIM capacitor, by which a dual-stack structure can be provided using a general logic forming process.

2. Discussion of the Related Art

FIGS. 1A to 1F are cross-sectional diagrams for explaining a capacitor fabricating method according to a related art.

FIG. 1A shows a step of forming a first conductive layer and an insulating layer on a semiconductor substrate.

Referring to FIG. 1A, a first insulating film 1 for insulation from devices below is stacked on a semiconductor substrate on which the FEOL process of a semiconductor device (i.e., transistor formation) has been performed in a general manner. The first insulating layer 1 is then planarized. A first metal layer 2 is stacked on the resultant structure after planarization and is then patterned by photolithography. A second insulating layer 3 is stacked on the resultant structure after photolithography and etching, and the insulating layer 3 is then planarized by CMP or the like.

FIG. 1B shows a step of forming a via hole and stacking a second metal layer.

Referring to FIG. 1B, the second insulating layer 3 is etched to form a via hole 5 over the first metal layer 2 by photolithography. Metal is deposited on the substrate to fill up the via hole, and the deposited metal is planarized. Then, a second metal layer 6 is deposited on the second insulating layer 3 including the metal filling the via hole 5. A portion of the second metal layer 6 will be used as a lower electrode of a capacitor. In doing so, the second metal layer 6 contains a multi-layer including Ti/TiN/Al_Cu/Ti/TiN or the like.

FIG. 1C shows a step of stacking a dielectric layer and an upper electrode layer of a capacitor.

Referring to FIG. 1C, a dielectric layer 7 to be used as a dielectric of a capacitor and a third metal layer 8 to be used as an upper electrode of the capacitor are stacked over the substrate in turn. Namely, the dielectric layer 7 is formed 500~1,000 Å thick by depositing a SiN layer by PECVD. And, the third metal layer 8 is deposited on the dielectric layer 7 over the substrate to be used as the upper electrode of the capacitor. In doing so, the third metal layer 8 contains a multi-layer including Ti/TiN.

FIG. 1D shows a step of patterning an upper electrode of a capacitor.

Referring to FIG. 1D, photoresist is coated over the substrate. The photoresist is patterned into a photoresist pattern 9 defining an upper electrode by exposure and development. The third metal layer is then etched using the photoresist pattern 9 as an etch mask.

FIG. 1E shows a step of patterning a lower electrode of the capacitor.

Referring to FIG. 1E, after the photoresist pattern has been removed from the structure shown in FIG. 1D, photoresist is coated on the resultant structure. Exposure and development is carried out on the photoresist to form another photoresist pattern 10 defining a lower electrode 14 and a second level of metallization 15. The second metal layer is then etched using the photoresist pattern 10 as an etch mask.

FIG. 1F shows a step of forming wires of the upper and lower electrodes of the capacitor.

Referring to FIG. 1F, after the photoresist pattern 10 in FIG. 1E has been removed, a third insulating layer 11 as an interlayer is stacked over the substrate. Via holes 12 of the upper and lower electrodes are formed by photolithography. Finally, wires 13 of the upper and lower electrodes are formed on the third insulating layer 11 including the via holes 12.

However, the related art capacitor fabricating method cannot increase the size of the capacitor to provide sufficient capacitance for certain applications without undue area consumption.

SUMMARY OF THE INVENTION

Accordingly, the present invention is directed to a method of fabricating an MIM capacitor that substantially obviates one or more problems due to limitations and disadvantages of the related art.

An object of the present invention is to provide a method of fabricating an MIM capacitor, by which higher capacitance can be secured per unit volume and/or area by forming a dual-stack type capacitor to increase an effective area of the capacitor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating an MIM capacitor according to the present invention includes the steps of patterning a first metal layer on a first insulating layer on a substrate, forming a planarized second insulating layer having a trench exposing a first portion of the patterned first metal layer therein, forming a second metal layer within the trench, forming a first dielectric layer on the second metal layer, forming first via holes exposing second portions of the patterned first metal layer, forming first plugs filling the trench and the first via holes, respectively, forming a third metal layer over the first plugs, forming a second dielectric layer on the third metal layer, forming a patterned fourth metal layer on the second dielectric layer, patterning the second dielectric layer and the third metal layer, forming a planarized third insulating layer having second via holes therein over the third and fourth metal layers, and forming a patterned fifth metal layer on the third insulating layer including the second via holes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2I are cross-sectional diagrams for explaining a method of fabricating a capacitor according to the present invention.

Figure 1A:
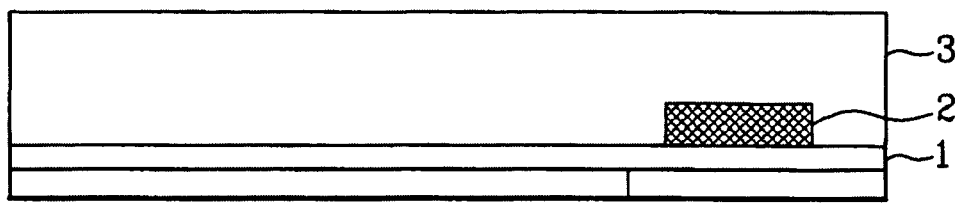
FIGS. 1A to 1F are cross-sectional diagrams for explaining a conventional capacitor fabricating method.
Figure 1B:
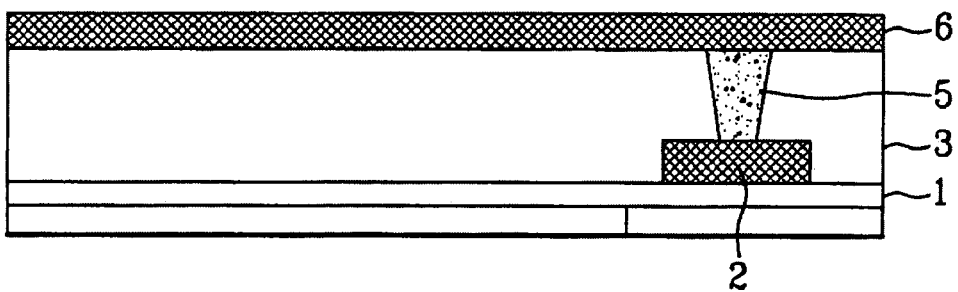
Figure 1C:
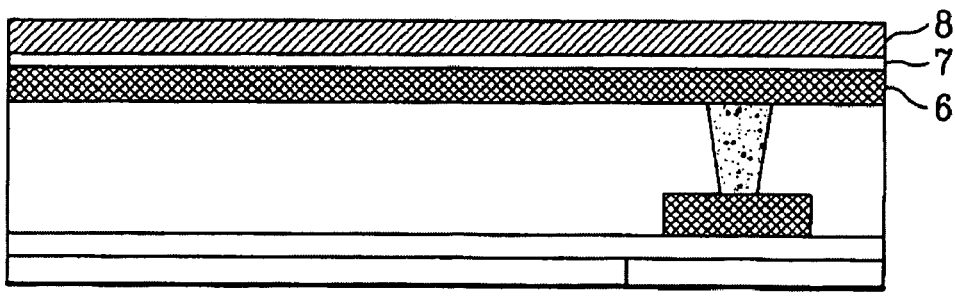
Figure 1D:
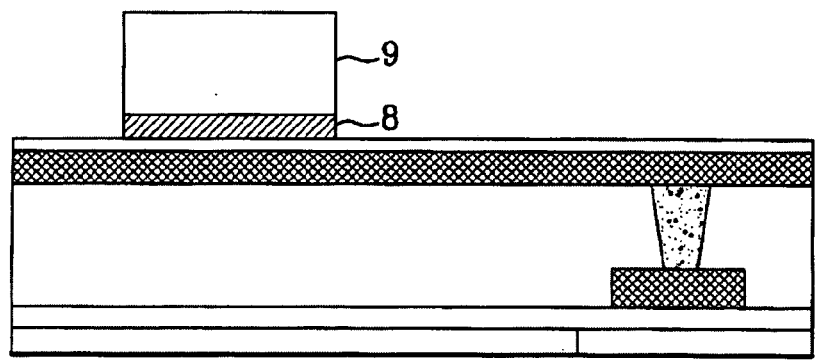
Figure 1E:
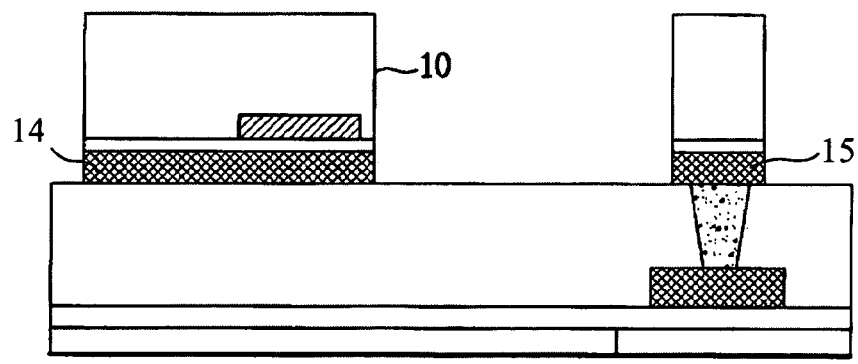
Figure 1F:
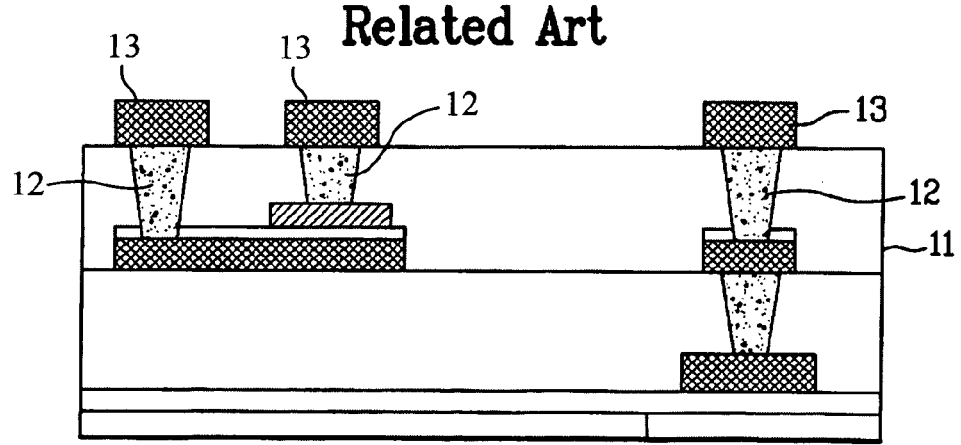
Figure 2A:
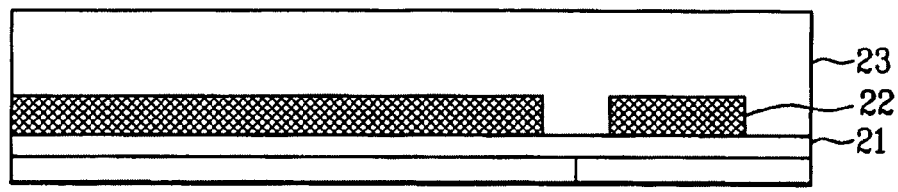
FIGS. 2A to 2I are cross-sectional diagrams for explaining a method of fabricating a capacitor according to the present invention.

FIG. 2A shows steps of forming a first insulating layer and a first metal layer in turn on a substrate provided with prescribed devices formed therein, patterning the first metal layer, forming a second insulating layer, and then planarizing the second insulating layer.

Referring to FIG. 2A, a first insulating layer 21 for insulation from devices below is stacked on a semiconductor substrate on which a conventional FEOL process for semiconductor devices (i.e., transistor formation) has been performed in a general manner. The first insulating layer 21 is then planarized. A first metal layer 22 is deposited on the resultant structure after planarization (i.e., the planarized first insulating layer 21) and is then patterned by photolithography and etching. A second insulating layer 23 is deposited on the resultant structure after completion of photolithography and is then planarized by CMP or the like.

Figure 2B:
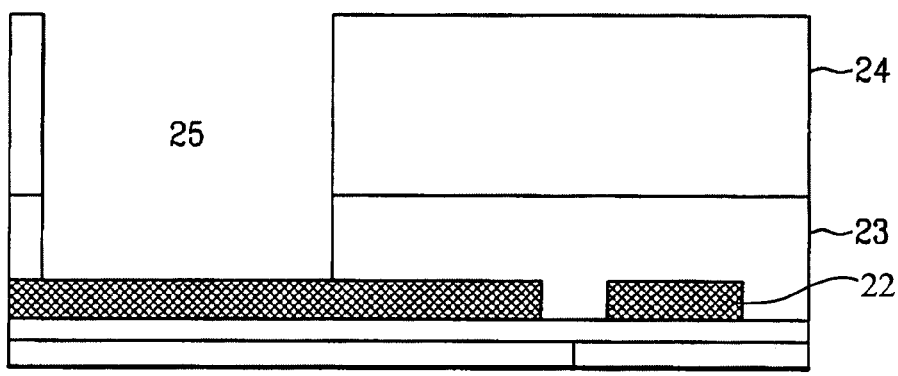

FIG. 2B shows a step of forming a trench by etching the second insulating layer.

Referring to FIG. 2B, photoresist is coated on the second insulating layer. Exposure and development is carried out on the photoresist to form a photoresist pattern 24. The second insulating layer is etched using the photoresist pattern 24 as an etch mask to form a trench 25. In doing so, a portion of the first metal layer 22 is exposed through the trench 25.

Figure 2C:
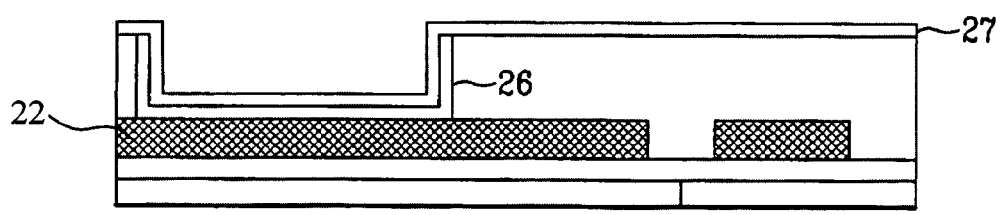

FIG. 2C shows steps of forming a second metal layer over the substrate, planarizing the second metal layer, and forming a first dielectric layer.

Referring to FIG. 2C, after the photoresist pattern in FIG. 2B has been removed, a second metal layer 26 is stacked over the substrate. The second metal layer 26 is planarized by CMP to remain in the trench only. The second metal layer 26 may comprise a multi-layer structure such as Ti/TiN and is generally used as a lower electrode of a capacitor. The lower electrode may include the first metal layer 22 only, but in order to increase the effective area of the capacitor, the second metal layer 26 is also used.

Subsequently, a first conformal dielectric layer 27 is blanket deposited onto the substrate. The first dielectric layer 27 may comprise $SiO_2$, SiON, SiN, and the like, and may be deposited by a conformal deposition process such as PECVD. Specifically, the first dielectric layer 27 may comprise a multi-layer structure such as SiN/SiON to reduce leakage current. Preferably, the first dielectric layer 27 is about 500 to about 1,000 Å thick.

Figure 2D:
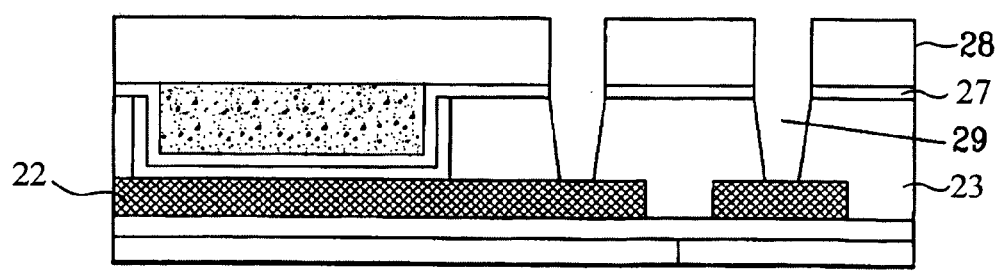

FIG. 2D shows a step of forming via holes over the substrate.

Referring to FIG. 2D, after photoresist has been coated on the substrate, exposure and development are carried out on the photoresist to form a photoresist pattern 28. The first dielectric layer 27 and the second insulating layer 23 exposed through the photoresist pattern 28 are then etched to form via holes 29 exposing portions of the first metal layer 22.

Figure 2E:
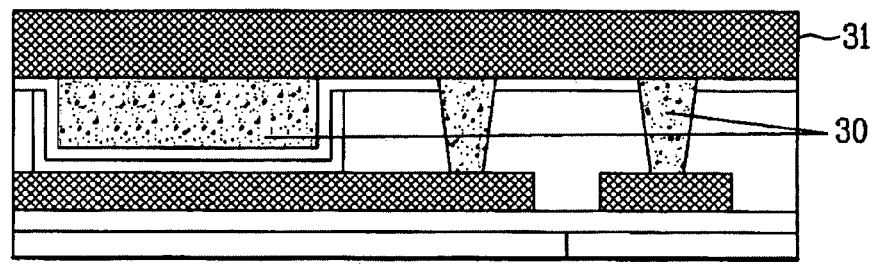

FIG. 2E shows steps of depositing a metal layer on the substrate to fill the via holes 29 in FIG. 2D, planarizing the metal layer, and forming a third metal layer thereon.

Referring to FIG. 2E, a metal layer is deposited on the substrate to fill up the trench and the via holes. Planarization such as by CMP or the like is carried out on the metal layer to leave portions 30 of the metal layer in the trench and the via holes only. The via/trench metal layer 30 may comprise a multi-layer structure consisting of Ti/TiN/Al_Cu, Ti/TiN/W, TaN/Cu or the like. Thereafter, a third metal layer 31 is deposited onto the substrate including the via/trench metal layer 30. The third metal layer 31 may comprise a multi-layer structure consisting of Ti/TiN/Al_Cu/Ti/TiN or the like.

Figure 2F:
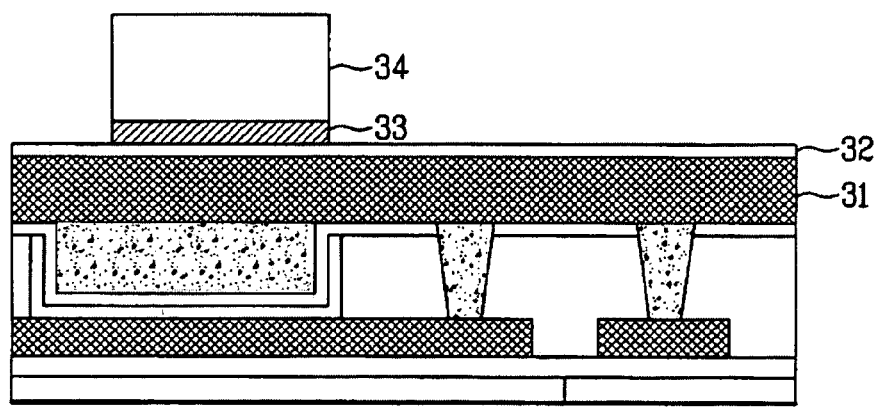

FIG. 2F shows steps of depositing a second dielectric layer and a fourth metal layer over the substrate and patterning the fourth metal layer and the second dielectric layer.

Referring to FIG. 2F, a second dielectric layer 32 and a fourth metal layer 33 are sequentially deposited onto the substrate. Photoresist is coated on the fourth metal layer 34. Exposure and development are carried out on the photoresist to form a photoresist pattern 34. The fourth metal layer is then etched using the photoresist pattern 34 as an etch mask. The second dielectric layer 32 may comprise $SiO_2$, SiON, SiN, or the like, and more particularly, a multi-layer structure comprising SiN/SiON to reduce leakage current. Preferably, the second dielectric layer 32 is about 500 to about 1,000 Å thick. Preferably, the fourth metal layer 33 comprises a Ti/TiN multi-layer and is about 1,500 to about 2,000 Å thick.

Figure 2G:
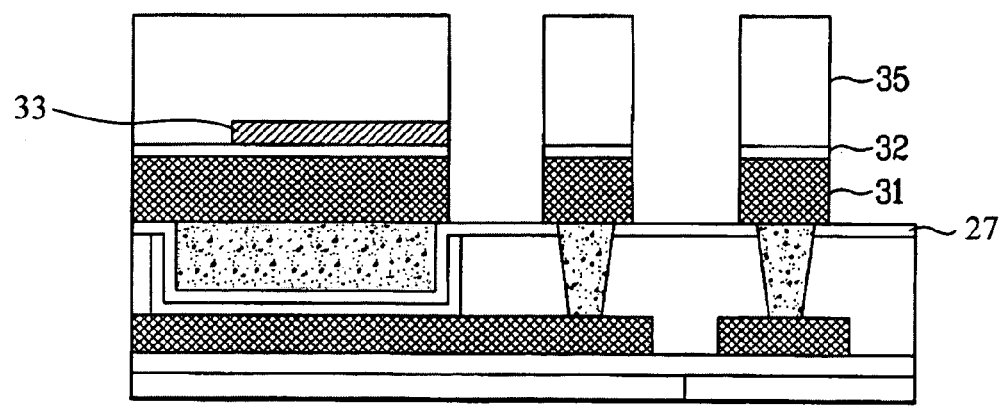

FIG. 2G shows a step of patterning the second dielectric layer and the third metal layer.

Referring to FIG. 2G, the photoresist pattern 34 in FIG. 2F is removed. Another photoresist pattern is then coated over the substrate. Exposure and development are carried out on the photoresist to form a new photoresist pattern 35 defining a capacitor. Subsequently, the second dielectric layer 32 and the third metal 31 are etched in turn using the new photoresist mask 35 as an etch mask.

Figure 2H:
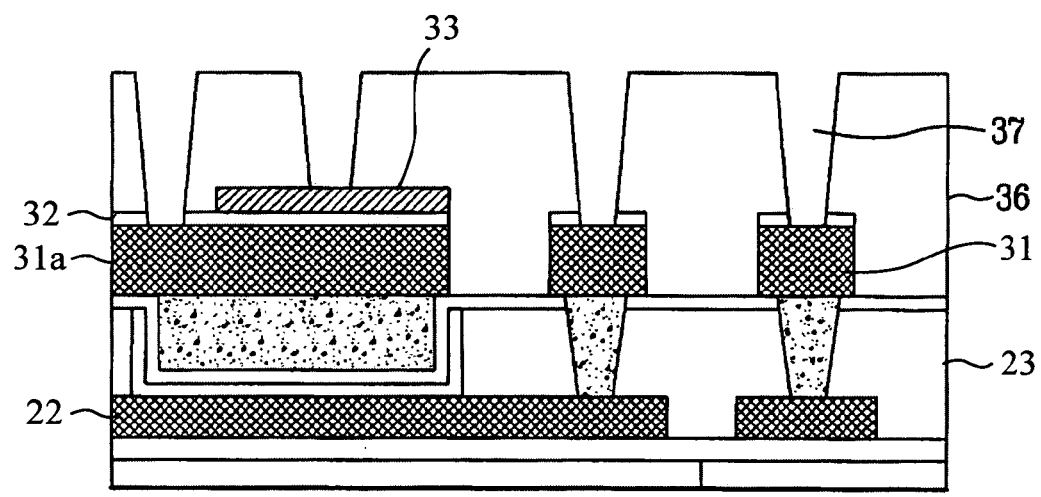

FIG. 2H shows steps of forming to planarize a third dielectric layer over the substrate and forming second via holes in the third dielectric layer.

Referring to FIG. 2H, after the photoresist pattern 35 in FIG. 2G has been removed, a third insulating layer 36 is blanket deposited over the substrate and is then planarized. The third insulating layer 36 may comprise a TEOS-based glass. Preferably, the third insulating layer 36 comprises the same material(s) as the second insulating layer.

Subsequently, the third insulating layer 36 is etched by photolithography to form second via holes 37. In doing so, the second via holes 37 communicate with an upper electrode 33, an intermediate electrode 31a, and (indirectly) a lower electrode 22.

Figure 2I:
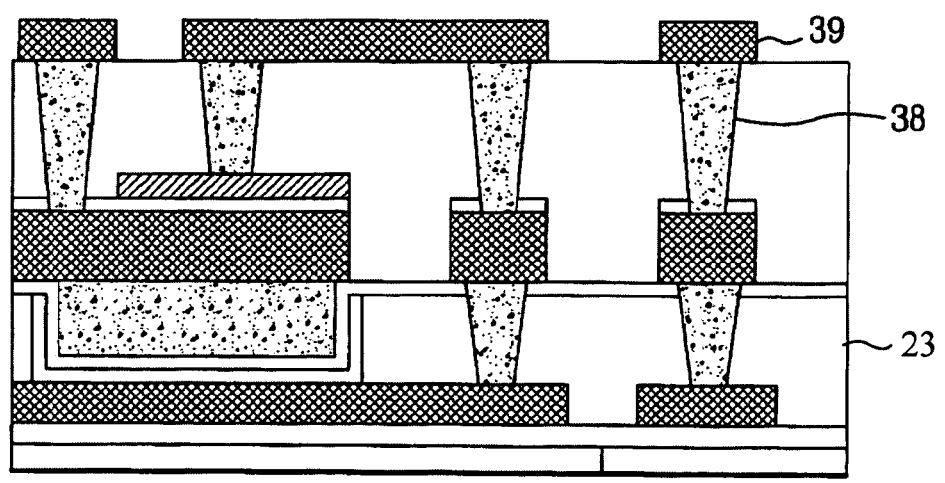

FIG. 2I shows steps of depositing and planarizing a metal layer 38 onto the substrate to fill up the second via holes and forming a fifth metal layer thereon to be patterned.

Referring to FIG. 2I, a metal layer is conformally deposited over the substrate and is then planarized by CMP or the like remain in the second via holes only, forming vias 38.

Subsequently, a fifth metal layer 39 is formed and patterned over the substrate to complete the capacitor according to the embodiment of the present invention. The fifth metal layer 39 generally comprises a multi-layer structure comprising Ti/TiN/Al_Cu/Ti/TiN or the like.

Accordingly, a method of fabricating an MIM capacitor according to the present invention enables higher capacitance per unit volume or area by forming a dual-stack type capacitor to increase an effective area of the capacitor.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a MIM capacitor, comprising the steps of:
    patterning a first metal layer on a first insulating layer on a substrate;
    forming a planarized second insulating layer having a trench exposing a first portion of the patterned first metal layer therein;
    forming a second metal layer within the trench;
    forming a first dielectric layer on the second metal layer;
    forming first via holes exposing second portions of the patterned first metal layer;
    forming first plugs filling the trench and the first via holes;
    forming a third metal layer over the first plugs in the trench and the first via holes;
    forming a second dielectric layer on the third metal layer;
    forming a patterned fourth metal layer on the second dielectric layer;
    patterning the second dielectric layer and the third metal layer;
    forming a planarized third insulating layer having second via holes therein over the third and fourth metal layers; and
    forming a patterned fifth metal layer on the third insulating layer including the second via holes.

2. The method of claim 1, wherein the first dielectric layer comprises $SiO_2$, a silicon oxynitride (SiON), or silicon nitride (SiN).

3. The method of claim 1, wherein the first dielectric layer is from about 500 to about 1,000 Å thick.

4. The method of claim 1, wherein each of the third and fifth metal layers comprises a Ti/TiN/Al_Cu/Ti/TiN multi-layer.

5. The method of claim 1, wherein the second dielectric layer is from about 500 to about 1,000 Å thick.

6. The method of claim 1, wherein the second dielectric layer comprises $SiO_2$, a silicon oxynitride (SiON), or silicon nitride (SiN).

7. The method of claim 1, wherein the fourth metal layer comprises a Ti/TiN multi-layer about 1,500 to about 2,000 Å thick.

8. The method of claim 1, wherein the first metal layer forms at least part of a lower capacitor electrode.

9. The method of claim 1, wherein the patterned fourth metal layer forms at least part of an intermediate capacitor electrode.

10. The method of claim 1, wherein the fifth metal layer forms an upper capacitor electrode.

11. A MIM capacitor, comprising:
    a first metal layer on a first insulating layer on a substrate;
    a planarized second insulating layer having a trench over a first portion of the first metal layer;
    a second metal layer in the trench;
    a first dielectric layer on the second metal layer;
    first vias over second portions of the first metal layer;
    first plugs in the trench and the first vias;
    a third metal layer over the first plugs, the first plugs bring in the trench and the first vias;
    a second dielectric layer on the third metal layer;
    a fourth metal layer on the second dielectric layer;
    a planarized third insulating layer having second vias therein over the third and fourth metal layers; and
    a fifth metal layer on the third insulating layer and the second via holes.

12. The MIM capacitor of claim 11, wherein the first dielectric layer comprises $SiO_2$, a silicon oxynitride (SiON), or silicon nitride (SiN).

13. The MIM capacitor of claim 11, wherein the first dielectric layer is from about 500 to about 1,000 Å thick.

14. The MIM capacitor of claim 11, wherein each of the third and fifth metal layers comprises an Al_Cu alloy.

15. The MIM capacitor of claim 11, wherein the second dielectric layer is from about 500 to about 1,000 Å thick.

16. The MIM capacitor of claim 11, wherein the second dielectric layer comprises $SiO_2$, a silicon oxynitride (SiON), or silicon nitride (SiN).

17. The MIM capacitor of claim 11, wherein the fourth metal layer comprises a Ti/TiN multi-layer about 1,500 to about 2,000 Å thick.

18. The MIM capacitor of claim 11, wherein the first metal layer forms at least part of a lower capacitor electrode.

19. The MIM capacitor of claim 11, wherein the fourth metal layer forms at least part of an intermediate capacitor electrode.

20. The MIM capacitor of claim 11, wherein the fifth metal layer forms an upper capacitor electrode.

* * * * *